(12) United States Patent
Nozawa (10) Patent No.: US 6,414,390 B2
(45) Date of Patent: *Jul. 2, 2002

(54) SEMICONDUCTOR DEVICE AND METHOD OF MANUFACTURING THE SAME, CIRCUIT BOARD AND ELECTRONIC INSTRUMENT (75) Inventor: Kazuhiko Nozawa, Nagano-ken (JP)

(73) Assignee: Seiko Epson Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/729,959

(22) Filed: Dec. 6, 2000

Related U.S. Application Data (63) Continuation of application No. 09/424,484, filed as application No. PCT/JP99/01410 on Mar. 19, 1999, now Pat. No. 6,180,000.

(30) Foreign Application Priority Data

Mar. 27, 1998 (JP) .............................. 10-082265

(51) Int. Cl.⁷ .................. H01L 21/44; H01L 21/48; H01L 21/50
(52) U.S. Cl. ................. 257/737; 257/734; 257/780; 257/784; 257/676; 257/691; 438/106; 438/613
(58) Field of Search ................. 257/106, 737, 257/734, 780, 784, 691, 676; 438/106, 613

(56) References Cited

U.S. PATENT DOCUMENTS 5,463,229 A  10/1995  Takase et al.
5,471,092 A  11/1995  Chan et al.
5,554,887 A   9/1996  Sawai et al.
6,010,769 A   1/2000  Sasaoka et al.
6,181,010 B1 * 1/2001  Nozawa

FOREIGN PATENT DOCUMENTS

JP   A-57-89244    6/1982
JP   A-64-1257     1/1989
JP   A-1-196856    8/1989
JP   A-1-209746    8/1989
JP   A-6-188551    7/1994
JP   A-6-302604   10/1994
JP   B2-7-105586  11/1995

* cited by examiner

Primary Examiner—Wael Fahmy
Assistant Examiner—D. M. Collins
(74) Attorney, Agent, or Firm—Oliff & Berridge PLC (57) ABSTRACT A semiconductor device and method of manufacturing the same, a circuit board and an electronic instrument are such that without substrate material selection or additional steps after connection, connection reliability can be assured, while direct connection to a substrate is possible, further allowing an electronic instrument to be made more compact and lightweight. The semiconductor device comprises a semiconductor chip (100) having electrodes (104), an interconnect layer (120) connected to the electrodes (104), a conducting layer (122) provided on the interconnect layer (120) avoiding the area of the electrodes (104), an underlying metal flyer (124) having a size larger than the peripheral outline of the conducting layer (122) provided on the conducting layer (122) and easier to be deformed than the conducting layer (122), bumps (200) provided on the underlying metal layer (124), and a resin layer (126) provided on the periphery of the conducting layer (122).

29 Claims, 9 Drawing Sheets

SEMICONDUCTOR DEVICE AND METHOD OF MANUFACTURING THE SAME, CIRCUIT BOARD AND ELECTRONIC INSTRUMENT

This is a Continuation of application Ser. No. 09/424,484 filed Nov. 23, 1999 now U.S. Pat. No. 6,001,006. The entire disclosure of the prior application(s) is hereby incorporated by reference herein in its entirety.

TECHNICAL FIELD

The present invention relates to a semiconductor device and method of manufacturing the same, a circuit board and an electronic instrument.

BACKGROUND OF ART

Conventionally, the underlying metal of solder bumps is formed by a barrier metal thin film directly formed on the electrode (normally aluminum) and formed at substantially the same size, and a metal thin film formed directly on the barrier metal thin film at substantially the same size and with good wettability with solder. The same construction is used, even when an interconnect layer is formed on a semiconductor chip.

In recent years, with the more compact design of electronic instruments, there has been an active move toward directly connecting a semiconductor device having solder bumps to the substrate, to provide even more compact and lightweight electronic instruments. In view of this, there is an increasing demand for a reliable connection of the semiconductor chip to a substrate with a greatly differing coefficient of thermal expansion. For example, as disclosed in Japanese Patent Publication No. 7-105586, a construction has been proposed whereby the underlying metal of substantially the same size as the solder bumps is formed as a multilayer metal layer providing stress relief.

However, for the actual connection of the semiconductor device, the are problems of the process becoming complicated or additional materials cost being incurred, because for example the mounting is on a substrate restricted to having a coefficient of thermal expansion close to that of the semiconductor chip, or the semiconductor chip is limited in size, or after the connection an additional step of injecting resin is required.

The present invention solves the above problems, and has as its object the provision of a semiconductor device and method of manufacture thereof, a circuit board and an electronic instrument such that without requiring selection of the substrate material or additional steps after connection, connection reliability can be assured, direct connection to a substrate is possible, and further an electronic instrument can be made more compact and lightweight.

DISCLOSURE OF THE INVENTION (1) A semiconductor device of the present invention comprises:
 a semiconductor chip having electrodes;
 an interconnect layer connected to the electrodes;
 a conducting layer formed on the interconnect layer, avoiding a position where the electrodes are provided;
 an underlying metal layer formed on the conducting layer, the underlying metal layer having a size larger than a peripheral outline of the conducting layer, and being more easily deformed than the conducting layer;
 a bump formed on the underlying metal layer; and
 a resin layer (insulating protection layer) formed around the conducting layer.

According to the present invention, as the conducting layer is deformed by thermal stress, so the underlying metal layer also deforms. Since a resin layer is provided around the conducting layer, the large part of the thermal stress is applied to the underlying metal layer rather than the conducting layer, and since the underlying metal layer can be greatly deformed, the thermal stress can be absorbed. As a result, the force applied by thermal stress on the conducting layer is reduced, and failure of conduction by shearing of the conducting layer can be suppressed.

(2) In this semiconductor device,
 the bump may be formed having a size larger than the peripheral outline of the conducting layer; and
 a projected area of a region in which the bump contacts with the underlying metal layer may be larger than a projected area of a region in which the underlying metal layer contacts with the conducting layer.

(3) In this semiconductor device,
 the resin layer may contact at least a portion of a lower surface of the underlying metal layer.

(4) In this semiconductor device,
 wherein the resin layer may be formed being separated from a lower surface of the underlying metal layer.

(5) In this semiconductor device,
 an adhesive may be provided between the lower surface of the underlying metal layer and the resin layer.

(6) In this semiconductor device,
 the conducting layer may have a height approximately in a range 12 to 300 µm, and a diameter approximately in a range 20 to 100 µm.

By means of this, since the conducting layer is easily deformed, the thermal stress can be efficiently absorbed.

(7) A circuit board of the present invention has the above-described semiconductor device mounted thereon.

(8) An electronic instrument of the present invention is equipped with the above-described semiconductor device.

(9) A method of manufacturing a semiconductor device of the present invention comprises:
 a step of preparing a semiconductor chip having electrodes and an interconnect layer connected to the electrodes;
 a step of forming a conducting layer on the interconnect layer, avoiding a position where the electrodes are provided;
 a step of forming an underlying metal layer on the conducting layer, the underlying metal layer having a size larger than a peripheral outline of the conducting layer, and being more easily deformed than the conducting layer;
 a step of forming a bump on the underlying metal layer; and
 a step of forming a resin layer around the conducting layer.

With a semiconductor device manufactured according to the present invention, as the conducting layer is deformed by thermal stress, so the underlying metal layer also deforms. Since a resin layer is provided around the conducting layer, the large part of the thermal stress is applied to the underlying metal layer rather than the conducting layer, and since the underlying metal layer can be greatly deformed, the thermal stress can be absorbed. As a result, the force applied by thermal stress on the conducting layer is reduced, and failure of conduction by shearing of the conducting layer can be suppressed.

(10) In this method of manufacturing a semiconductor device, the steps of forming the conducting layer and the resin layer may comprise:

a first step of providing an opening in a formation of the resin layer, as a formation region for the conducting layer, on the interconnect layer;

a second step of filling the opening by a printing method with a conductive paste having a conductive filler distributed in a binder; and a third step of heating the conductive paste and hardening the, binder, to cause the binder intimate contact with the interconnect layer.

By means of this, the opening of the resin layer can easily be filled with the conductive paste by a printing method.

(11) In this method of manufacturing a semiconductor device, in the third step, the conductive filler may be fused, to cause intimate contact with the interconnect.

By means of this, since the conductive filler is fused, a conducting layer in intimate contact with the interconnect can be formed.

(12) In this method of manufacturing a semiconductor device, the step of forming the underlying metal layer may comprise:

after forming the conducting layer and the resin layer, a first step of adhering a metal foil provided with an adhesive avoiding a contact portion with the conducting layer on the conducting layer and the resin layer in a vacuum, creating a vacuum in a space between the conducting layer and the metal foil at atmospheric pressure, and bringing the conducting layer and the metal foil into intimate contact; and a second step of patterning the metal foil in a form of the underlying metal layer.

By means of this, by adhering and patterning the metal foil, the underlying metal layer can be formed easily.

(13) In this method of manufacturing a semiconductor device, the step of forming the conducting layer and the underlying metal layer may comprise:

a first step of providing a first conducting material in a region including a formation region of the conducting layer;

a second step of forming a first resist layer having a first opening which is provided at a formation region of the conducting layer and positioned on the first conducting material;

a third step of providing a second conducting material within the first opening and on the first conducting material;

a fourth step of forming on the first resist layer a second resist layer having a second opening formed at a formation region of the underlying metal layer;

a fifth step of providing a metal material in the second opening to form the underlying metal layer; and a sixth step of removing the first and second resist layers, patterning the first conducting material, and forming the conducting layer from a portion of the first conducting material and the second conducting material.

BEST MODE FOR CARRYING OUT THE INVENTION

The present invention is now described in terms of a number of preferred embodiments, with reference to the drawings.

First Embodiment

Figure 1:
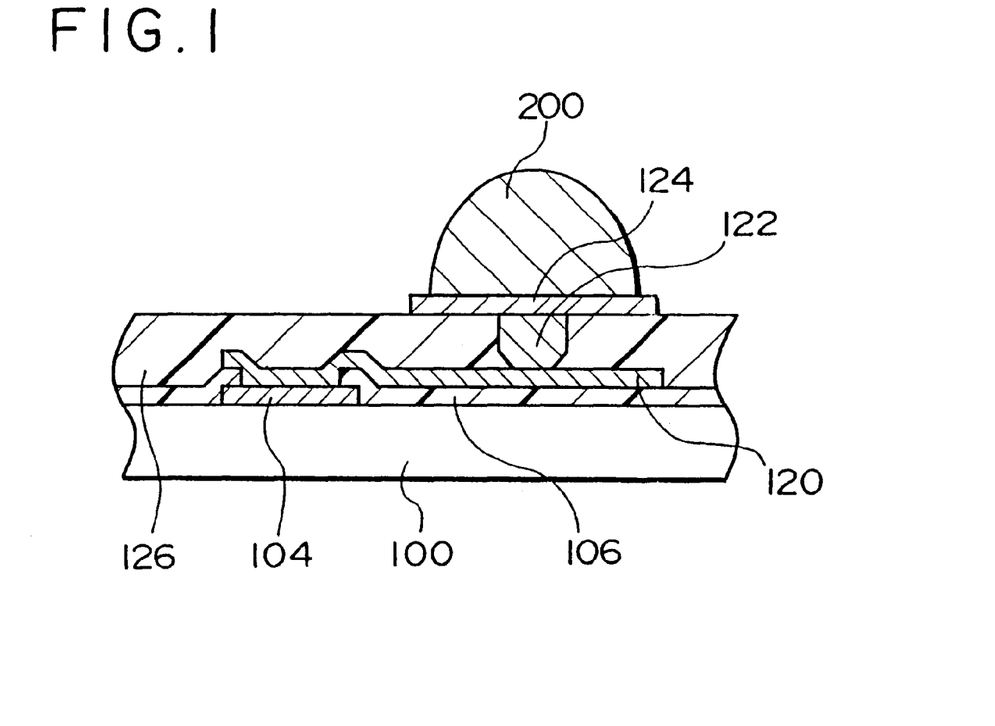
FIG. 1 shows a first embodiment of the semiconductor device of the present invention.

FIG. 1 shows a first embodiment of the semiconductor device of the present invention. The semiconductor device shown in FIG. 1 comprises a semiconductor chip (semiconductor chip) 100 on which is provided a bump 200 with a stress relief function interposed. This configuration allows flip-chip having a stress relief function, and can also be classified as CSP (Chip Size/Scale Package).

The semiconductor chip 100 comprises a plurality of elements such as gates (not shown in the drawings). On the semiconductor chip 100, a plurality of electrodes 104 are formed. On the surface of the semiconductor chip 100 on which the electrodes 104 are formed, an insulating layer 106 is formed, avoiding the area where the electrodes 104 are provided. The insulating layer 106 may be formed as a silicon oxide film. It should be noted that, as other examples, a silicon nitride film, or polyimide, or the like may be used. To the electrodes 104 are connected an interconnect layer 120 is connected, and the interconnect layer 120 extends into a region avoiding the electrodes 104. The interconnect layer 120 is formed on the insulating layer 106.

In the position (part or region) of the interconnect layer 1avoiding the electrodes 104 are provided a conducting layer 122. The conducting layer 122 can be formed from any of an alloy including Ni, an alloy including Cu, Cu, Ni, Sn, solder, Au, Ag, Fe, Zn, Cr, and Co. The height of the conducting layer 122 is at least approximately 12 $\mu$m, preferably at least approximately 15 $\mu$m, and even more preferably 20 $\mu$m. The height of the conducting layer 122 is not more than approximately 300 $\mu$m, and preferably not more than approximately 200 $\mu$m, and if not more than approximately 100 $\mu$m can be fabricated by a simple method. The conducting layer 122 may, form a cylindrical shape, and it is preferable for the diameter thereof to be of the order of from 20 to 100 µm. The conducting layer 122 may also be a cylindrical with a diameter of about 60 µm and a height of about 50 µm. By the conducting layer 122 having a form which is deformed easily, failure of conduction through shearing is avoided. As a method of fabricating the conducting layer 122 can be employed electroplating.

On the conducting layer 122, an underlying metal layer 124 of for example copper or the like is provided. The underlying metal layer 124 is formed with a size larger than the peripheral outline of the conducting layer 122, and is more easily deformed than the conducting layer 122 (with a lower coefficient of elasticity). To provide this deformability, the underlying metal layer 124 is preferably formed to be thinner (shorter in thickness) than the conducting layer 122. Alternatively, the underlying metal layer 124 may be formed of an easily deformable material. The underlying metal layer 124 may be in the form of a cylinder, and in this case may be of diameter approximately 60 µm and height approximately 50 µm. As the method of forming the underlying metal layer 124 may be employed electroplating.

On the interconnect layer 120 is formed a resin layer 126 of for example polyimide resin. The resin layer 126 is an insulating protective layer which forms a protective film for the interconnect layer 120. The resin layer 126 is provided around the conducting layer 122. The resin layer 126 may be formed to contact the entire lower surface of the underlying metal layer 124. In this case, thermal stress applied to the underlying metal layer 124 is absorbed over the entire lower surface of the underlying metal layer 124 by the resin layer 126.

Figure 2:
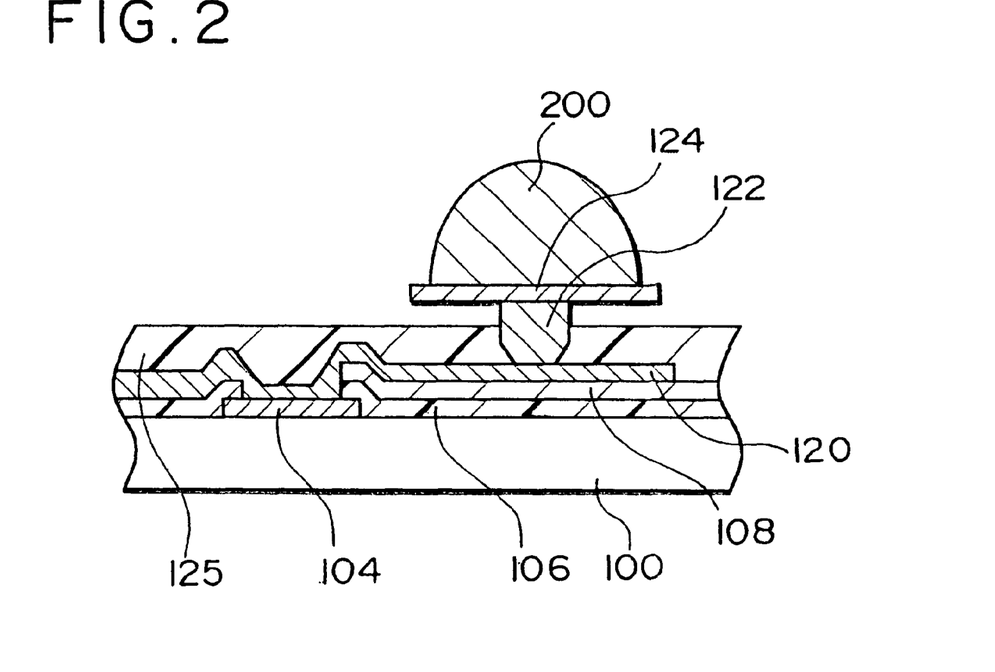
FIG. 2 shows a modification of the first embodiment of the semiconductor device of the present invention.

Alternatively, as in the modification shown in FIG. 2, a resin layer 125 may be provided separated from the underlying metal layer 124. In this case the underlying metal layer 124 is easily deformed. It should be noted that in FIG. 2, a separate insulating layer 108 is formed on the insulating layer 106. The insulating layer 106 may be formed of a silicon oxide film, and the insulating layer 108 may be formed of a polyimide resin.

Figure 3:
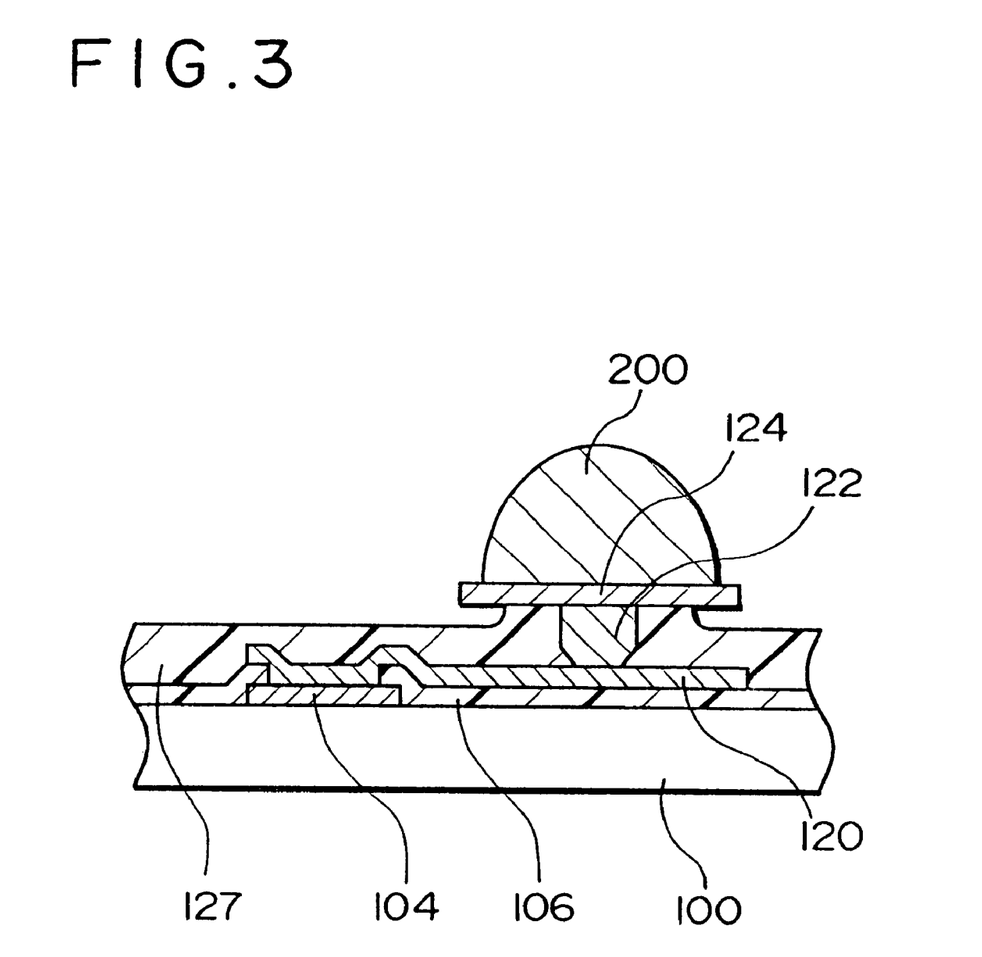
FIG. 3 shows another modification of the first embodiment of the semiconductor device of the present invention.

Alternatively, as in the modification shown in FIG. 3, a resin layer 127 may contact a part of the underlying metal layer 124. In this case, the resin layer 127 may contact around the periphery of the portion where the conducting layer 122 contacts with the lower surface of the underlying metal layer 124, and the resin layer 127 may not contact the outer periphery of the underlying metal layer 124. In this way, because the resin layer 127 contacts a part of the lower surface of the underlying metal layer 124, a balance between the thermal stress absorbed by the resin layer 127, and the ease of deformation of the underlying metal layer 124 can be achieved.

On the underlying metal layer 124, the bump 200 is provided. The bump 200 is commonly a solder bump. For example, solder in the, form of cream solder or the like may be placed on the underlying metal layer 124 and heated, the solder thus fusing, to form a ball-shaped bump 200. For the provision of the cream solder, the method of solder printing can be applied. The bump 200 is commonly formed with a size exceeding the peripheral outline of the conducting layer 122. The projected area of the region in which the bump 200 and underlying metal layer 124 contact each other is commonly larger than the projected area of the region in which the underlying metal layer 124 and conducting layer 122 contact each other.

According to this embodiment, as the conducting layer 122 is deformed by thermal stress, the underlying metal layer 124 also deforms. Since the resin layer 126 is provided around the conducting layer 122, the large part of the thermal stress is applied to the underlying metal layer 124 rather than the conducting layer 122, and the underlying metal layer 124 can be greatly deformed, as a result of which the thermal stress can be absorbed. As a result, the force applied by thermal stress on the conducting layer 122 is reduced, and failure of conduction by shearing of the conducting layer 122 can be suppressed.

Second Embodiment

Figure 4A:
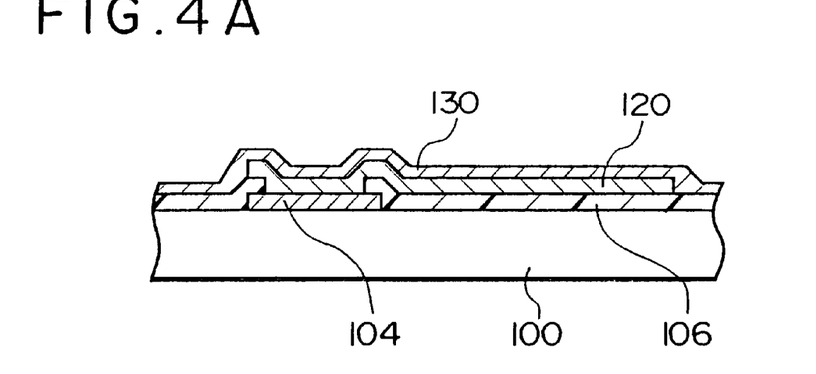
FIGS. 4A to 4C show the method of manufacturing a second embodiment of the semiconductor device of the present invention.

FIGS. 4A to 6B show the method of manufacturing a second embodiment of the semiconductor device of the present invention. In this embodiment, as shown in FIG. 4A, a semiconductor chip 100 is provided with electrodes 104 and an interconnect layer 120 connected to the electrodes 104. It should be noted that on the semiconductor chip 100 an insulating layer 106 is formed, and an interconnect layer 120 is formed on the insulating layer 106.

Then, a conducting layer is provided on the interconnect layer 120, at a position avoiding where the electrodes 104 are provided, and an underlying metal layer is provided on the conducting layer. In more detail, the following first to sixth steps are carried out.

First Step

As shown in FIG. 4A, at least on the interconnect 120, and at least in a region including the forming region of the conducting layer, a first conducting material 130 is formed. The first conducting material 130 may be formed over the whole surface of the semiconductor chip 100 on which the electrodes 104 are formed. As a method of forming the metal film 130 may be employed vapor deposition, electroless plating, and so on, but the sputtering method is preferable.

Second Step

Figure 4B:
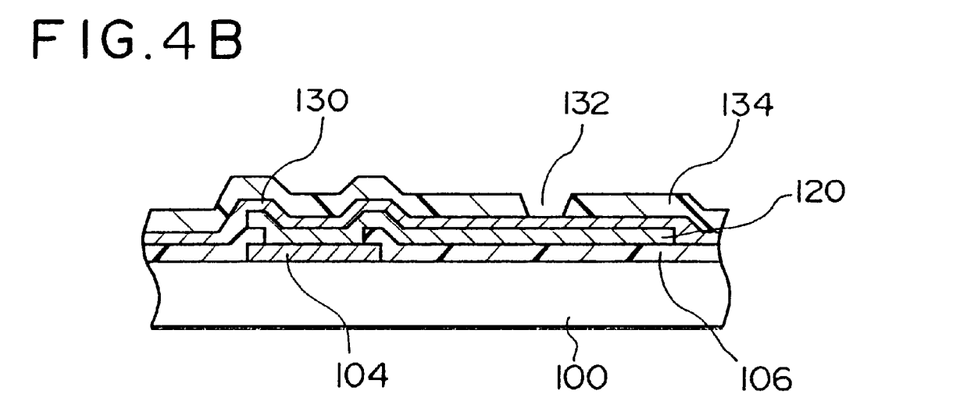

As shown in FIG. 4B, a first resist layer 134 is formed. The first resist layer has a first opening formed over the first conducting material 130, at a region where the conducting layer is formed. As the first resist layer 134, a photosensitive resin (photo resist) can be used. As a method of forming the first opening 132 may be used lithography (photolithography) involving exposure through a mask and development. Alternatively, the first resist layer 134 in which the first opening 132 is formed may be formed by screen printing or transfer printing.

Third Step

Figure 4C:
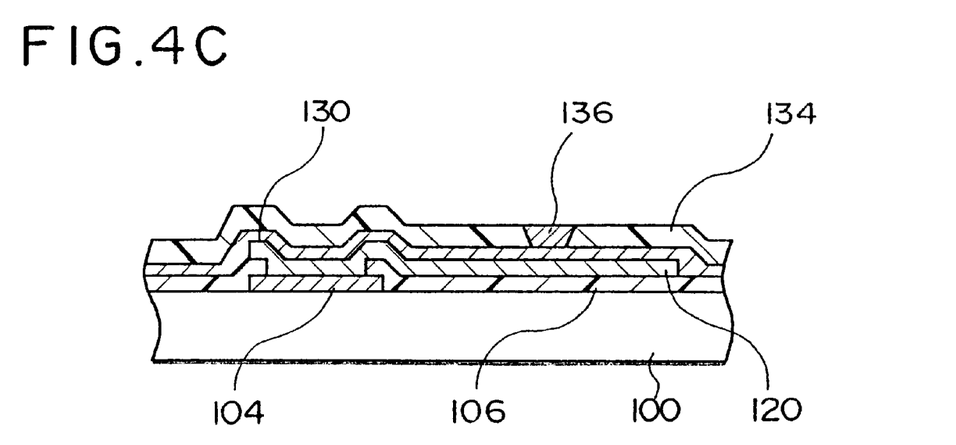

As shown in FIG. 4C, within the first opening 132, and on the first conducting material 130, a second conducting material 136 is provided. For example, with the first conducting material 130 as an electrode, by immersing the internal surface of the first opening 132 in a plating fluid, the second conducting material 136 can be formed. In this case, as a method of drawing out the electrode, for example, a contact pin may be brought into contact with the internal surface of the first opening 132, or a contact pin may be brought into contact so as to puncture the first resist layer 134. Alternatively, vapor deposition, sputtering, or electroless plating may be used to provide the second conducting material 136.

Fourth Step

Figure 5A:
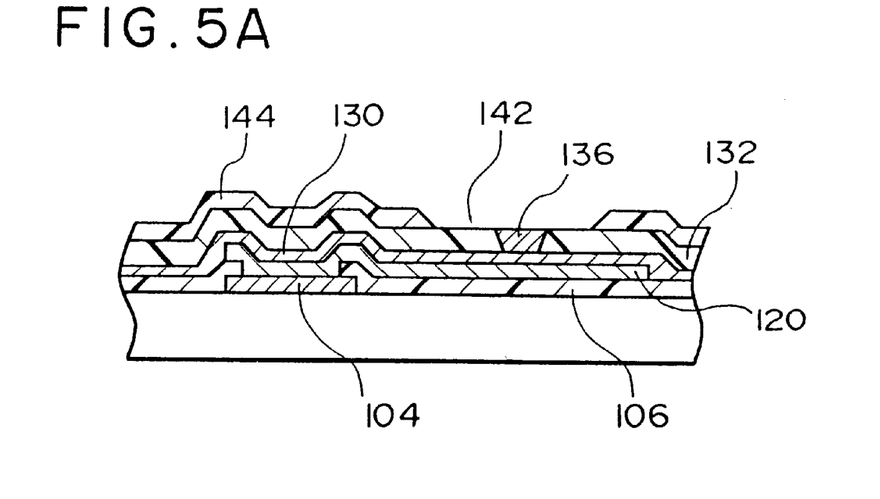
FIGS. 5A to 5C show the further method of manufacturing the second embodiment of the semiconductor device of the present invention.

As shown in FIG. 5A, a second resist layer 144 is formed on the first resist layer 134. A second resist layer 144 has a second opening 142 provided in a position where the underlying metal layer is formed. The second resist layer 144 can be selected from the materials which can be used to form the first resist layer 134. For the method of formation of the second opening 142, the method of forming the first opening 132 in the first resist layer 134 can be employed.

Fifth Step

Figure 5B:
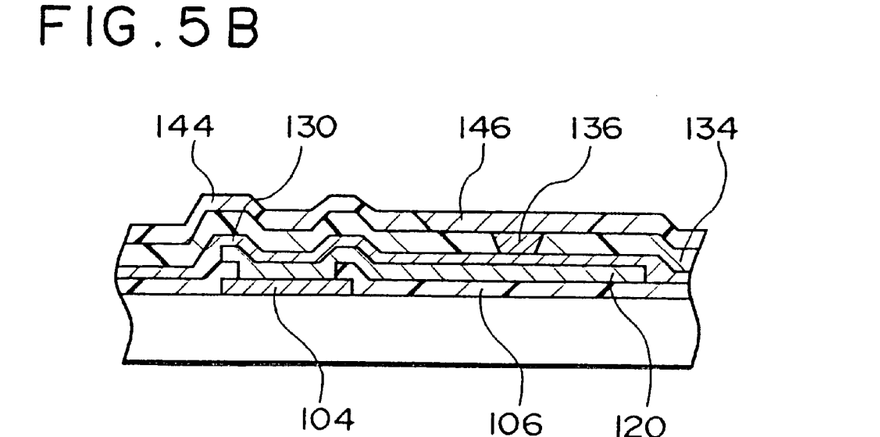

As shown in FIG. 5B, a metal material is provided in the second opening 142, to form an underlying metal layer 146. For the method of forming the underlying metal layer 146, the method of formation when providing the second conducting material 136 can be employed.

Sixth Step

Figure 5C:
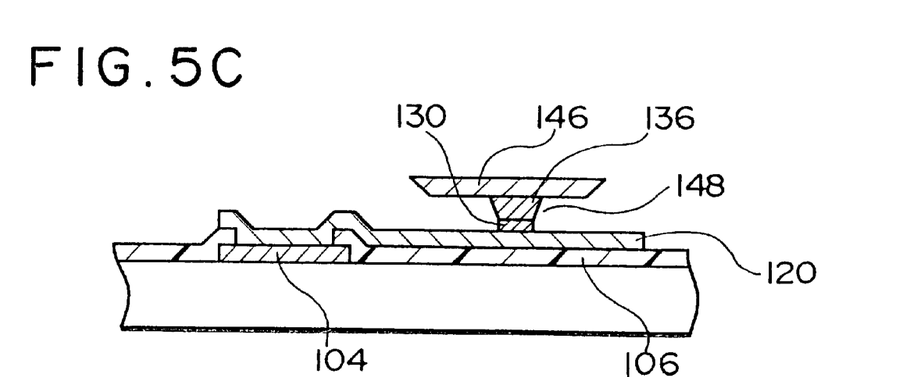

As shown in FIG. 5C, the first and second resist layers 134 and 144 are removed, the first conducting material 130 is patterned, and a conducting layer 148 is formed from a portion of the first conducting material 130 and second conducting material 136. As a method of patterning the first conducting material 130 may be employed a method using a solvent, a method using a removing agent, a method using a plasma, a method using etching, or a combination thereof.

Figure 6A:
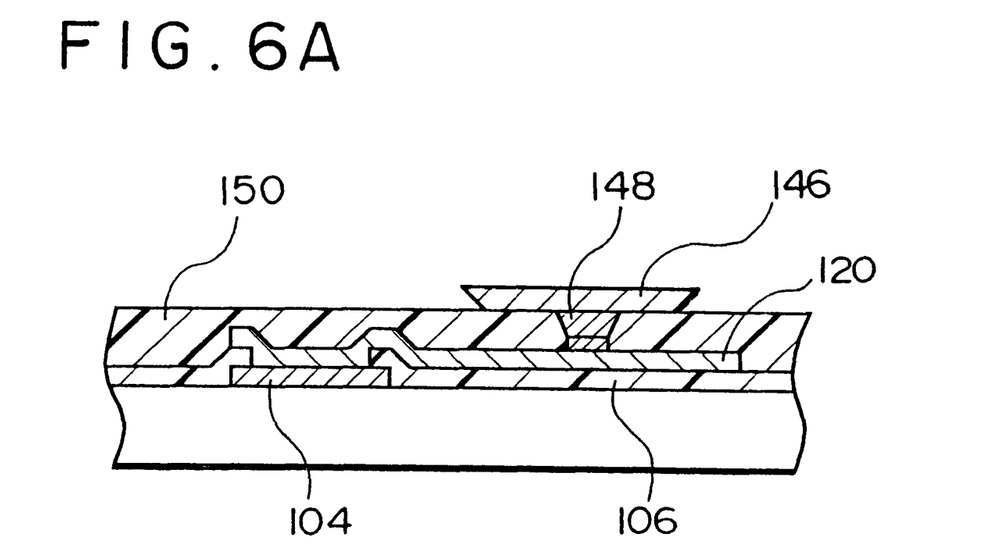
FIGS. 6A to 6B show the still further method of manufacturing the second embodiment of the semiconductor device of the present invention.

When the above process is completed, as shown in FIG. 6A, a resin layer 150 is provided around the conducting layer 148. The resin layer 150 may be formed of a resin such as polyimide, epoxy, silicon, benzocyclobutene, or the like. As the method of formation may be used immersion coating, roll-coating, spray coating, vapor deposition, potting, or the like, but of method of spin coating is preferably employed. In the event of adherence in positions in which the resin should not be applied, such as the upper surface of the underlying metal layer 146, the resin may be selectively removed by dissolving, plasma, etching, or similar methods. Alternatively, resin may first be applied to cover the entire surface of the underlying metal layer 146, then the resin removed until the upper surface of the underlying metal layer 146 is exposed. Alternatively, the resin may be mechanically ground or abrade to expose the surface of the underlying metal layer 146.

Figure 6B:
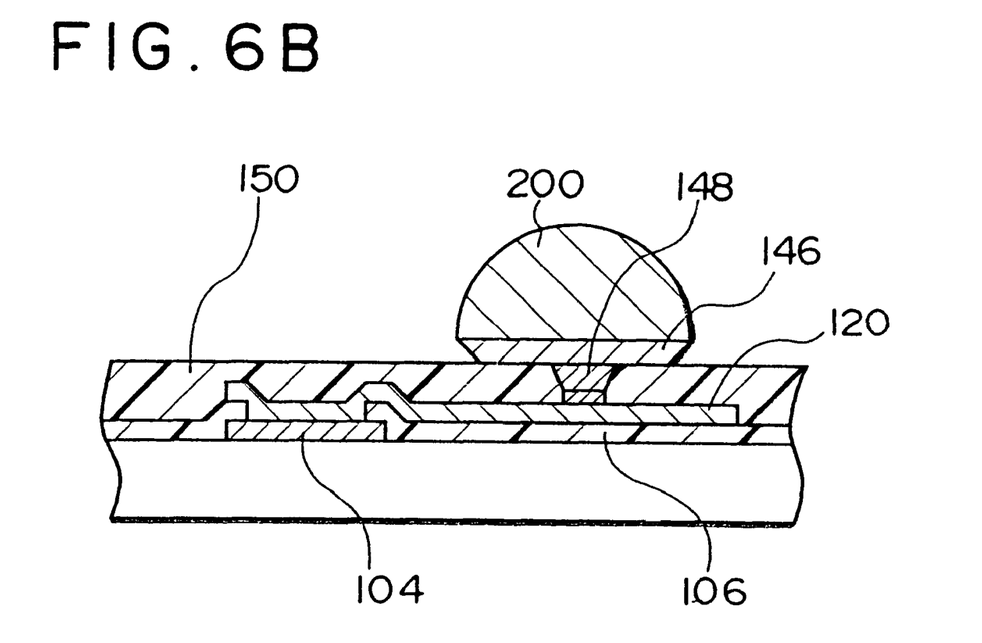

Next, as shown in FIG. 6B, a bump 200 is provided on the underlying metal layer 146. For example, cream solder may be disposed on the underlying metal layer 146 by screen printing or an individual supply method, then this may be heated, and thus a ball-shaped bump 200 is formed. Alternatively, molten solder may be supplied individually, or ball-shaped solder may be supplied and then heated.

With a semiconductor device manufactured by the above process, together with deformation of the conducting layer 148 by thermal stress, the underlying metal layer 146 also deforms. Since the resin layer 150 is provided around the conducting layer 148, large part of the thermal stress is applied to the underlying metal layer 146 rather than the conducting layer 148, and the underlying metal layer 146 can be greatly deformed, as a result of which the thermal stress can be absorbed. As a result, the force applied by thermal stress on the conducting layer 148 is reduced, and failure of conduction by shearing of the conducting layer 148 can be suppressed.

Third Embodiment

FIGS. 7A to 8C show the method of manufacturing a third embodiment of the semiconductor device of the present invention.

Steps of Providing a Conducting Layer and the Resin Layer

First Step

Figure 7A:
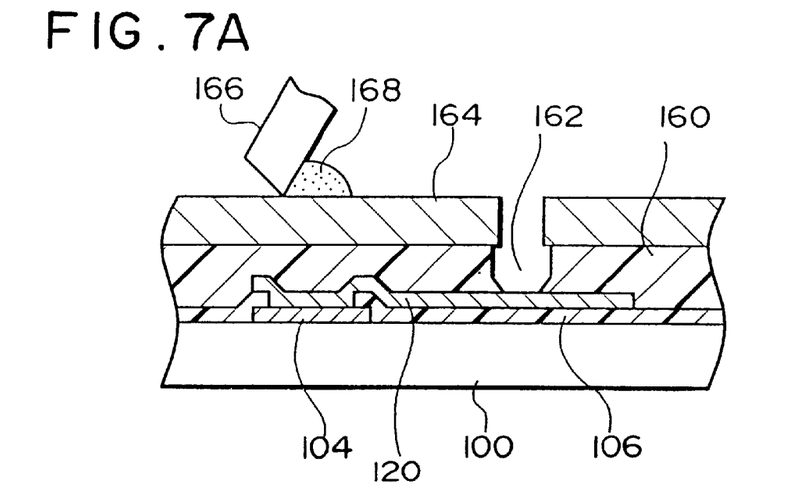
FIGS. 7A to 7C show the method of manufacturing a third embodiment of the semiconductor device of the present invention.

As shown in FIG. 7A, a resin layer 160 is formed to have an opening 162 which is provided on the interconnect 120 at a region where the conducting layer is formed.

Second Step

Figure 7B:
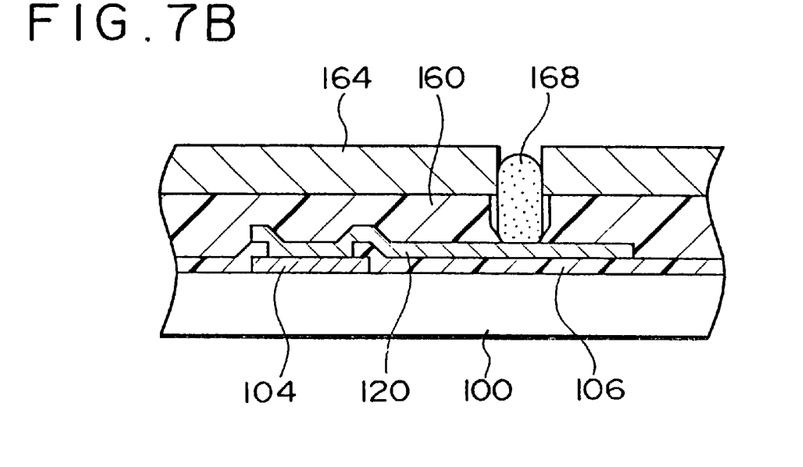

As shown in FIGS. 7A and 7B, the opening portion of a stencil is aligned with the opening 162, and by means of a squeegee 166 the opening 162 is filled with a conductive paste 168. In other words, screen printing is carried out. Here, the conductive paste 168 has a conductive filler distributed in a binder. By means of screen printing, a plurality of openings 162 can be filled with the conductive paste 168 in a single operation. Alternatively, dispensing printing may equally be used. Dispensing printing is appropriate when the opening 162 is deep.

Third Step

Figure 7C:
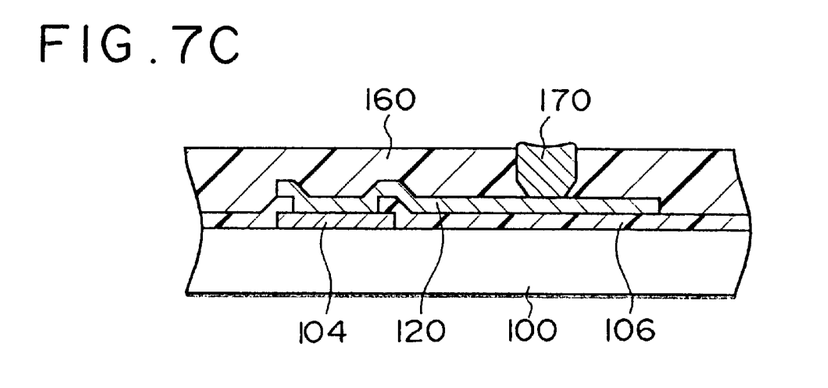

As shown in FIG. 7C, the conductive paste 168 is heated, and the binder is hardened. Alternatively, the binder may equally be baked, and the conductive filler may be fused. For example, the conductive paste 168 may be irradiated with a laser. By this means, a surface of the conductive paste 168 contacts with the interconnect 120, and therefore a conducting layer 170 is formed in intimate contact on the interconnect 120. By the above process, the conducting layer 170 can be formed without a plating process.

Steps of Providing the Underlying Metal Layer

First Step

Figure 8A:
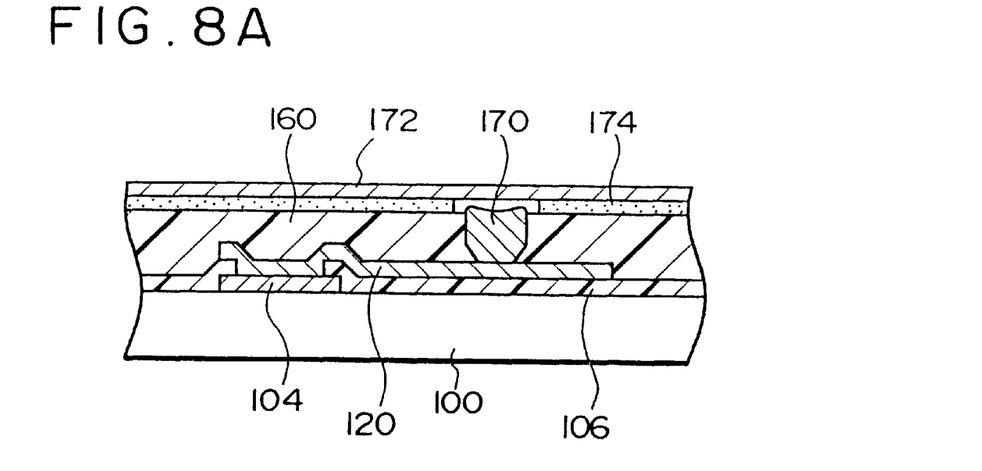
FIGS. 8A to 8C show the further method of manufacturing the third embodiment of the semiconductor device of the present invention.
Figure 8B:
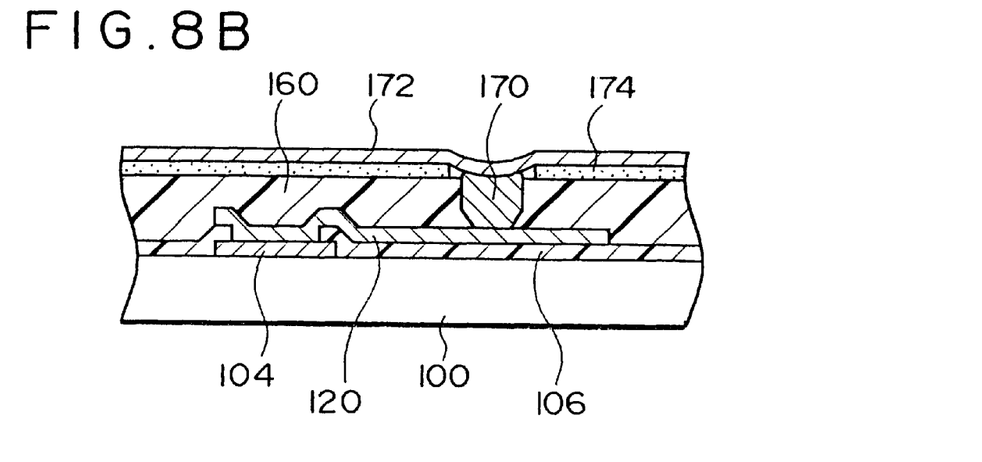

As shown in FIG. 8A, a metal foil 172 provided with adhesive to avoid at a portion other than the area of contact with the conducting layer 170 is adhered on the conducting layer 170 and resin layer 160. This step is carried out in a vacuum. Next, the pressure is returned to atmospheric pressure, and as shown in FIG. 8B, a vacuum is created in the space between the conducting layer 170 and the metal foil 172, and thus the conducting layer 170 and metal foil 172 are brought into intimate contact. By this means, the resistance value between the conducting layer 170 and the metal foil 172 is reduced.

Second Step

Figure 8C:
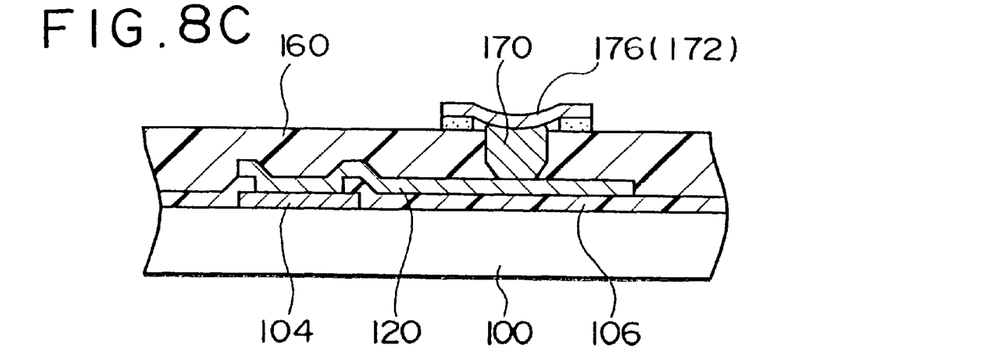

As shown in FIG. 8C, the metal foil 172 is patterned in the shape of an underlying metal layer 176. Thereafter, a bump is formed on the underlying metal layer 176. The conducting layer 170 is formed of a conductive paste, but since the underlying metal layer 176 is interposed, the conductive paste and the bump do not come into direct contact. Therefore, if for example silver paste is used as the conductive paste, and solder is used as the material of the bump, even if the two would fuse under the influence of heat, they are not mixed. According to this embodiment, since the metal foil 172 is adhered and patterned, the underlying metal layer 176 can be formed simply.

Figure 9:
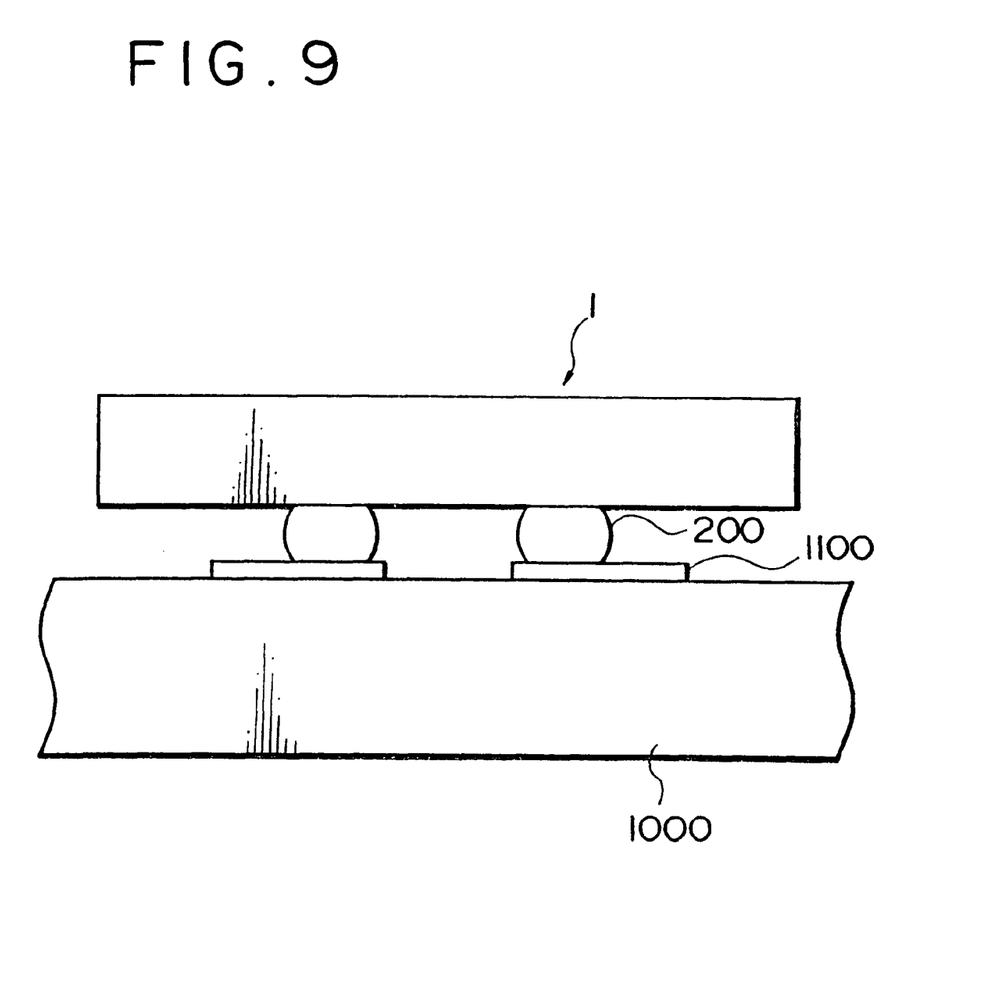
FIG. 9 shows a circuit board on which the semiconductor device of this embodiment is mounted.

In FIG. 9 is shown a circuit board 1000 on which is mounted this embodiment of the semiconductor device 1. For the circuit board 1000 is generally used an organic substrate such as a glass epoxy substrate or the like. On the circuit board 1000, an interconnect pattern 1100 of for example copper is formed to constitute a desired circuit, and by mechanical connection of the interconnect pattern thereof to the bumps 200 forming the external electrodes of the semiconductor device 1, electrical connection is achieved. The semiconductor device 1 is provided with a function to relieve thermal stress generated as a result of the difference between the coefficient of thermal expansion of the circuit board 1000 and the coefficient of thermal expansion of the semiconductor chip.

Figure 10:
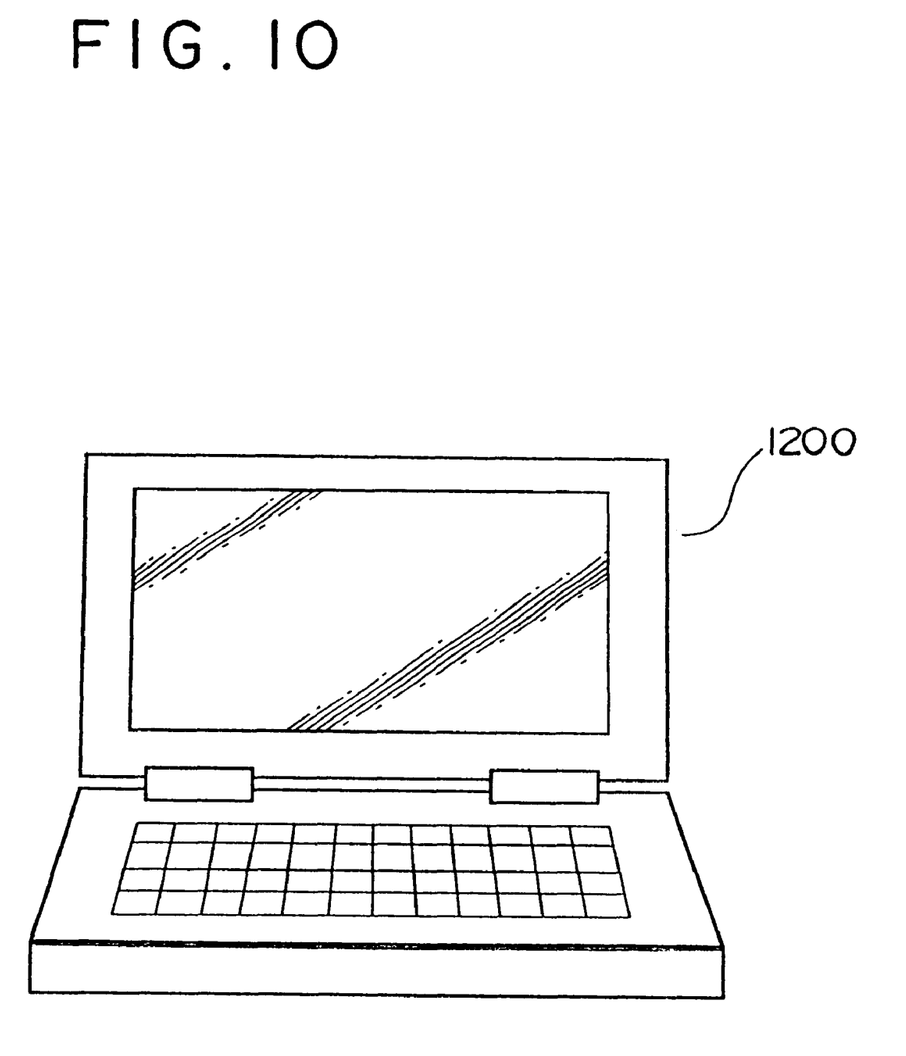
FIG. 10 shows an electronic instrument equipped with the semiconductor device of this embodiment.

In FIG. 10, as an electronic instrument 1200 having a semiconductor device 1 to which the present invention is applied, a notebook personal computer is shown.

It should be noted that, in the above described structural elements of the present invention, "semiconductor chip" may be replaced by "electronic element," and in the same way as for a semiconductor chip the electronic element (regardless whether an active element or a passive element) can be mounted on a substrate and an electronic component can be fabricated. As electronic components fabricated using such electronic elements, for example, may be cited resistors, capacitors, coils, oscillators, filters, temperature sensors, thermistors, varistors, variable resistors, and fuses.

What is claimed is:

1. A semiconductor device comprising:
    a semiconductor chip having electrodes;
    an interconnect layer connected to said electrodes;
    a conducting layer formed on said interconnect layer, avoiding an overlap with said electrodes when a view is taken in a direction perpendicular to a surface of said semiconductor chip on which said electrodes are provided;
    an underlying metal layer formed on said conducting layer, said underlying metal layer having a size larger than a peripheral outline of said conducting layer when said view is taken;
    a bump formed on said underlying metal layer; and
    a resin layer formed around said conducting layer.

2. The semiconductor device as defined in claim 1 wherein:
    said bump is formed having a size larger than the peripheral outline of said conducting layer; and
    an area of a region in which said bump contacts with said underlying metal layer is larger than an area of a region in which said underlying metal layer contacts with said conducting layer.

3. The semiconductor device as defined in claim 1, wherein said resin layer contacts at least a portion of a lower surface of said underlying metal layer.

4. The semiconductor device as defined in claim 2, wherein said resin layer contacts at least a portion of a lower surface of said underlying metal layer.

5. The semiconductor device as defined in claim 1, wherein said resin layer is formed being separated from a lower surface of said underlying metal layer.

6. The semiconductor device as defined in claim 2, wherein said resin layer is formed being separated from a lower surface of said underlying metal layer.

7. The semiconductor device as defined in claim 1, wherein an adhesive is provided between the lower surface of said underlying metal layer and said resin layer.

8. The semiconductor device as defined in claim 1, wherein said conducting layer has a height approximately in a range 12 to 300 $\mu$m, and a diameter approximately in a range 20 to 100 $\mu$m.

9. The semiconductor device as defined in claim 7, wherein said conducting layer has a height approximately in a range 12 to 300 $\mu$m, and a diameter approximately in a range 20 to 100 $\mu$m.

10. A circuit board on which is mounted the semiconductor device as defined in claim 1.

11. A circuit board on which is mounted the semiconductor device as defined in claim 7.

12. A circuit board on which is mounted the semiconductor device as defined in claim 8.

13. A circuit board on which is mounted the semiconductor device as defined in claim 9.

14. An electronic instrument equipped with the semiconductor device as defined in claim 1.

15. An electronic instrument equipped with the semiconductor device as defined in claim 7.

16. An electronic instrument equipped with the semiconductor device as defined in claim 8.

17. An electronic instrument equipped with the semiconductor device as defined in claim 9.

18. The semiconductor device as defined in claim 1, wherein said underlying metal layer has a first surface in contact with said bump and a second surface opposite to said first surface, an area of said second surface being smaller than an area of said first surface.

19. A semiconductor device comprising:
    a semiconductor chip having electrodes;
    an interconnect layer connected to said electrodes;
    a conducting layer formed on said interconnect layer, avoiding an overlap with said electrodes when a view is taken in a direction perpendicular to a surface of said semiconductor chip on which said electrodes are provided;
    a bump electrically connected to said conducting layer; and
    a resin layer formed around said conducting layer, wherein an air space is formed between said resin layer and said bump.

20. The semiconductor device as defined in claim 19, wherein said conducting layer is exposed to said air space.

21. The semiconductor device as defined in claim 19, wherein said resin layer covers said conducting layer.

22. A circuit board on which is mounted the semiconductor device as defined in claim 19.

23. An electronic instrument equipped with the semiconductor device as defined in claim 19.

24. A semiconductor device comprising:
    a semiconductor chip having electrodes;
    an interconnect layer connected to said electrodes;
    a bump electrically connected to said interconnect layer with at least one conducting layer, avoiding an overlap with said electrodes when a view is taken in a direction perpendicular to a surface of said semiconductor chip on which said electrodes are provided; and
    a resin layer formed between said bump and said surface of said semiconductor chip on which said electrodes are provided.

25. The semiconductor device as defined in claim 24, further comprising a metal layer in contact with said bump, said metal layer provided on said conducting layer.

26. The semiconductor device as defined in claim 25, wherein said metal layer is formed from a material which is more easily deformed than said conducting layer.

27. The semiconductor device as defined in claim 24, wherein said resin layer having contact with at least part of said interconnect layer.

28. A circuit board on which is mounted the semiconductor device as defined in claim 24.

29. An electronic instrument equipped with the semiconductor device as defined in claim 24.

* * * * *

UNITED STATES PATENT AND TRADEMARK OFFICE
CERTIFICATE OF CORRECTION

PATENT NO. : 6,414,390 B2
DATED : July 2, 2002
INVENTOR(S) : Kazuhiko Nozawa

It is certified that error appears in the above-identified patent and that said Letters Patent is hereby corrected as shown below:

<u>Title page,</u>
Item [63], please change "Continuation of application No. 09/424,484, filed as application No. PCT/JP99/01410 on Mar. 19, 1999, now Pat. No. 6,180,000." to -- Continuation of application No. 09/424,484, filed as application No. PCT/JP99/01410 on Mar. 19, 1999, now Pat. No. 6,181,010. --

Signed and Sealed this

Tenth Day of December, 2002

JAMES E. ROGAN
*Director of the United States Patent and Trademark Office*